United States Patent
Chen

(10) Patent No.: US 8,284,125 B2
(45) Date of Patent: *Oct. 9, 2012

(54) ACTIVE MATRIX ORGANIC ELECTRO-LUMINESCENCE DISPLAY PANEL AND FABRICATION METHOD THEREOF

(75) Inventor: Yen-Chun Chen, Hsinchu (TW)

(73) Assignee: Ritdisplay Corporation, Hsinchu (TW)

( * ) Notice: Subject to any disclaimer, the term of this patent is extended or adjusted under 35 U.S.C. 154(b) by 1581 days.

This patent is subject to a terminal disclaimer.

(21) Appl. No.: 11/734,247

(22) Filed: Apr. 11, 2007

(65) Prior Publication Data

US 2008/0122755 A1    May 29, 2008

(30) Foreign Application Priority Data

Nov. 24, 2006  (TW) ............................... 95143498 A

(51) Int. Cl.
    *G09G 3/30*   (2006.01)
(52) U.S. Cl. .......................................... 345/76; 345/204
(58) Field of Classification Search .................. 345/76, 345/92, 103, 204; 257/40, 59, 72, 103; 315/169.1, 315/169.3; 438/4, 22, 29, 99; 313/506, 509
See application file for complete search history.

(56) References Cited

U.S. PATENT DOCUMENTS

| | | | | |
|---|---|---|---|---|
| 6,982,436 B2 * | 1/2006 | Uchida | ........................... | 257/98 |
| 7,148,622 B2 * | 12/2006 | Lin | ............................... | 313/504 |
| 2002/0044109 A1 * | 4/2002 | Kimura | ........................... | 345/76 |
| 2004/0246209 A1 * | 12/2004 | Sung | .............................. | 345/76 |
| 2005/0275606 A1 * | 12/2005 | Wu | ................................. | 345/76 |

* cited by examiner

*Primary Examiner* — Amare Mengistu
*Assistant Examiner* — Jennifer Zubajlo
(74) *Attorney, Agent, or Firm* — WPAT, P.C.; Anthony King

(57) ABSTRACT

An active matrix organic electro-luminescence display panel is provided. The display panel includes a substrate, an organic electro-luminescence device array, a driving circuit array and an insulating layer. A plurality of anodes of the organic electro-luminescence device array is disposed on the substrate. The circuit array is disposed on the organic electro-luminescence device array. The insulating layer is disposed on the substrate and located between the organic electro-luminescence device array and the driving circuit array. The insulating layer exposes a part of each the organic electro-luminescence device. Each driving circuit includes a scan line, a data line and a control unit. The control unit is electrically coupled to the scan line, the data line and a lower voltage source, while the corresponding organic electro-luminescence device is electrically coupled between the control unit and a higher voltage source.

12 Claims, 10 Drawing Sheets

ACTIVE MATRIX ORGANIC ELECTRO-LUMINESCENCE DISPLAY PANEL AND FABRICATION METHOD THEREOF

CROSS-REFERENCE TO RELATED APPLICATION

This application claims the priority benefit of Taiwan application serial no. 95143498, filed Nov. 24, 2006. All disclosure of the Taiwan application is incorporated herein by reference.

BACKGROUND OF THE INVENTION

1. Field of the Invention

The present invention generally relates to a luminescence display panel and the fabrication method thereof, and more particular, to an active matrix organic electro-luminescence display panel (active matrix OELD panel) and the fabrication method thereof.

2. Description of Related Art

The information communication industry has risen to a backbone industry in recent years, wherein various portable communication display products are counted as an development focus, in particular, the flat panel display (FPD) which functions as the important interface between man and information. Except organic electro-luminescence display (OELD), the other major kinds of FPDs are plasma display panel (PDP), liquid crystal display (LCD), electro-luminescent display, light emitting diode (LED), vacuum fluorescent display, field emission display (FED) and electro-chromic display. In comparison with the other FPD technologies, the OELD panel has the upper hand in self-emitting, no viewing angle dependency, electricity-saving, simpler process, low-cost, lower temperature operation range, fast responding and full colorization, so as to be overwhelming in application potential and expected to play a major role for the next generation FPD.

FIG. 1 is the schematic drawing of a conventional driving circuit. Referring to FIG. 1, a conventional driving circuit 100 is coupled with a higher voltage source $V_{DD}$ and a lower voltage source $V_{CC}$ to drive an organic electro-luminescence device OEL. The conventional driving circuit 100 includes a scan line 110, a data line 120 and a control unit 130, wherein the control unit 130 is electrically coupled to the scan line 110, the data line 120 and the higher voltage source $V_{DD}$, while the organic electro-luminescence device OEL is electrically coupled between the control unit 130 and the lower voltage source $V_{CC}$. Usually, the higher voltage source $V_{DD}$ is a positive voltage and the lower voltage source $V_{CC}$ takes normally 0V (the grounded status).

It is clear from FIG. 1, the control unit 130 in the driving circuit 100 comprises two thin film transistors (TFTs) T1 and T2 and a capacitor C. The TFT T1 has a gate G1, a source S1 and a drain D1, the gate G1 is electrically coupled to the scan line 110 and the drain D1 is electrically coupled to the data line 120. The TFT T2 has a gate G2, a source S2 and a drain D2, the gate G2 is electrically coupled to the source S1, the drain D2 is electrically coupled to the higher voltage source $V_{DD}$ and the source S2 is electrically coupled to the organic electro-luminescence device OEL. Noticeably, in the conventional driving circuit 100, the capacitor C is electrically coupled between the gate G2 and the drain D2.

When a scan signal $V_{s\_CAN}$ arrives at the scan line 110, the TFT T1 would be on and the data signal $V_{DATA}$ delivered by the data line 120 would be applied to the gate G2 of the TFT T2 via the TFT T1. The voltage signal $V_{DATA}$ applied to the gate G2 can control a current I flowing through the TFT T2 and the organic electro-luminescence device OEL, so as to control the luminance thereof. While the voltage signal $V_{DATA}$ delivered by the data line 120 is applied to the gate G2, the voltage signal $V_{DATA}$ also charges the capacitor C with a reference voltage of the higher voltage source $V_{DD}$. In other words, as the data signal $V_{DATA}$ is applied to the gate G2, the capacitor C records down the voltage between the G2 and D2 terminals of $|V_{DATA}-V_{DD}|$. Theoretically, as the TFT T1 is off, the capacitor C is able to effectively keep the voltage $|V_{DATA}-V_{DD}|$ applied to the gate G2 of the TFT T2 for a predetermined time length; but after a long term operation, the voltage $V_s$ at the source S2 of the TFT T2 would drift up, which makes the voltage difference $V_{gs}$ between the gate G2 and the source S2 gradually less and causes the luminance of the organic electro-luminescence device OEL decayed.

It can be seen from the above described, the control unit 130 in the driving circuit 100 is still unable to stably control the current I flowing through the organic electro-luminescence device OEL.

SUMMARY OF THE INVENTION

Accordingly, the present invention is directed to provide an active matrix organic electro-luminescence display panel and the fabrication method thereof, so that an organic electro-luminescence device is able to be stably luminescent and an active matrix organic electro-luminescence display panel accordingly has stable image quality.

The present invention provides an active matrix organic electro-luminescence display panel, which includes a substrate, an organic electro-luminescence device array, a driving circuit array and an insulating layer. The organic electro-luminescence device array includes a plurality of organic electro-luminescence devices arranged in an array, wherein a plurality of anodes of the organic electro-luminescence device array is disposed on the substrate. The driving circuit array is disposed on the organic electro-luminescence device array and includes a plurality of driving circuits arranged in an array, wherein the driving circuit is coupled with a higher voltage source and a lower voltage source to drive the corresponding organic electro-luminescence device. Each of the driving circuits includes a scan line, a data line and a control unit. The control unit is electrically coupled to the scan line, the data line and the lower voltage source, while the corresponding organic electro-luminescence device is electrically coupled between the control unit and the higher voltage source. The insulating layer is disposed on the substrate and located between the organic electro-luminescence device array and the driving circuit array, and exposes a part of each organic electro-luminescence device.

According to the active matrix OELD panel described by the embodiment of the present invention, the voltage of the above-mentioned higher voltage source is, for example, V1 volt, while the voltage of the above-mentioned lower voltage source is, for example, V2 volt and V1>V2=0.

According to the active matrix OELD panel described by the embodiment of the present invention, each of the above-mentioned control unit includes, for example, a first TFT, a second TFT and a capacitor. The first TFT has a first gate, a first source and a first drain, wherein the first gate is electrically coupled to the scan line and the first drain is electrically coupled to the data line. The second TFT has a second gate, a second source and a second drain, wherein the second gate is electrically coupled to the first source, the second source is electrically coupled to the lower voltage source and the second drain is electrically coupled to the corresponding organic electro-luminescence device. The capacitor is electrically coupled between the second gate and the second source.

According to the active matrix OELD panel described by the embodiment of the present invention, the above-mentioned first TFT and second TFT are, for example, an amorphous silicon TFT (a-Si TFT), a low temperature poly silicon TFT (LTPS TFT) or an organic silicon TFT.

According to the active matrix OELD panel described by the embodiment of the present invention, the above-mentioned organic electro-luminescence device array can further include a bus line, a plurality of organic functional layers and a plurality of cathodes electrically insulated from each other. The bus line is electrically coupled to the anodes, so as to make all the anodes simultaneously coupled to the higher voltage source. The organic functional layer is disposed on the anode, while the cathodes are disposed on the corresponding organic functional layer and electrically coupled to the corresponding second drain, respectively.

According to the active matrix OELD panel described by the embodiment of the present invention, the above-mentioned anodes are, for example, a plurality of stripe electrodes, wherein the extension direction is parallel to the extension direction of the scan lines, while the extension direction of the bus line is perpendicular to the extension direction of the scan lines.

According to the active matrix OELD panel described by the embodiment of the present invention, a protection layer can be further disposed on the insulating layer.

According to the active matrix OELD panel described by the embodiment of the present invention, a barrier pattern can be further disposed on the protection layer to electrically insulate the cathodes from each other.

According to the active matrix OELD panel described by the embodiment of the present invention, an organic material layer can be further disposed on the barrier pattern and a conductive material layer can be further disposed on the organic material layer, wherein the material of the organic material layer and the material of the organic functional layer are the same, while the material of the conductive material layer and the material of the cathode are the same.

According to the active matrix OELD panel described by the embodiment of the present invention, each of the above-mentioned organic functional layers includes, for example, a hole transporting layer, an organic electro-luminescence layer (OEL layer) and an electron transporting layer. The hole transporting layer is disposed on the corresponding anode, the OEL layer is disposed on the hole transporting layer and the electron transporting layer is disposed on the OEL layer.

According to the active matrix OELD panel described by the embodiment of the present invention, the above-mentioned organic electro-luminescence device array includes a common anode, a plurality of organic functional layers and a plurality of cathodes electrically insulated from each other. The common anode is disposed on the substrate and is electrically coupled to the higher voltage source. The organic functional layer is disposed on the common anode. The cathodes are disposed on the corresponding organic functional layers and electrically coupled to the corresponding second drains, respectively.

According to the active matrix OELD panel described by the embodiment of the present invention, a protection layer can be further disposed on the insulating layer.

According to the active matrix OELD panel described by the embodiment of the present invention, a barrier pattern can be further disposed on the protection layer to electrically insulate the cathodes from each other.

According to the active matrix OELD panel described by the embodiment of the present invention, an organic material layer can be further disposed on the barrier pattern and a conductive material layer can be further disposed on the organic material layer, wherein the material of the organic material layer and the material of the organic functional layer are the same, while the material of the conductive material layer and the material of the cathode are the same.

According to the active matrix OELD panel described by the embodiment of the present invention, each of the above-mentioned organic functional layers includes, for example, a hole transporting layer, an OEL layer and an electron transporting layer. The hole transporting layer is disposed on the corresponding anode, the OEL layer is disposed on the hole transporting layer and the electron transporting layer is disposed on the OEL layer.

According to the active matrix OELD panel described by the embodiment of the present invention, the above-mentioned common anode includes, for example, a plurality of openings and the control units are located over the corresponding openings.

The present invention further provides a method of fabricating an active matrix OELD panel, the method includes: first, forming a first conductive layer; next, forming an insulating layer on the substrate, wherein the insulating layer exposes a part of the conductive layer; after that, forming a driving circuit array on the insulating layer; then, forming a protection layer on the insulating layer; further, forming an organic functional layer on the part of the conductive layer exposed by the insulating layer; furthermore, forming a patterned second conductive layer on the substrate, wherein the second conductive layer is located on the organic functional layer and electrically coupled to the driving circuit array.

According to the method of fabricating an active matrix OELD panel described by the embodiment of the present invention, the above-mentioned first conductive layer is, for example, a plurality of stripe conductive material layers.

According to the method of fabricating an active matrix OELD panel described by the embodiment of the present invention, a bus line can be further formed on the substrate and a part of the first conductive layer before forming the insulating layer and after forming the first conductive layer.

According to the method of fabricating an active matrix OELD panel described by the embodiment of the present invention, a barrier pattern can be further formed on the protection layer before forming the organic functional layer and after forming the protection layer.

According to the method of fabricating an active matrix OELD panel described by the embodiment of the present invention, the method of forming the above-mentioned organic functional layer is, for example, an ink-jet printing process or a deposition process incorporated with a shadow mask.

According to the method of fabricating an active matrix OELD panel described by the embodiment of the present invention, a barrier pattern can be further formed on the protection layer before forming the second conductive layer and after forming the organic functional layer.

According to the method of fabricating an active matrix OELD panel described by the embodiment of the present invention, the method of forming the above-mentioned second conductive layer is, for example, a deposition process incorporated with a shadow mask Since the present invention makes the OEL device electrically coupled between the control unit and the higher voltage source, so that the driving current sequentially flows through the OEL device and the control unit under the control of the control unit. Therefore, the driving circuit of the present invention is able to make the OEL device stably luminescent.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
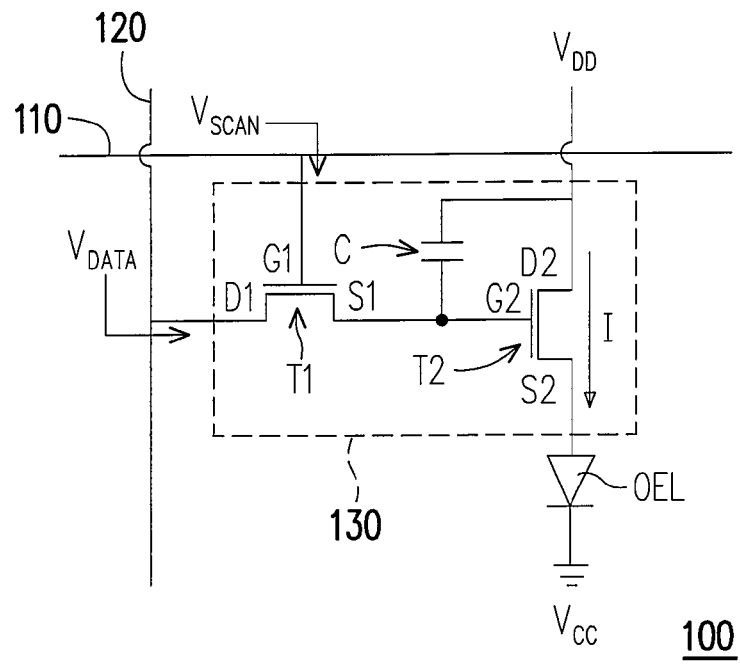
FIG. 1 is the schematic drawing of a conventional driving circuit.
Figure 2:
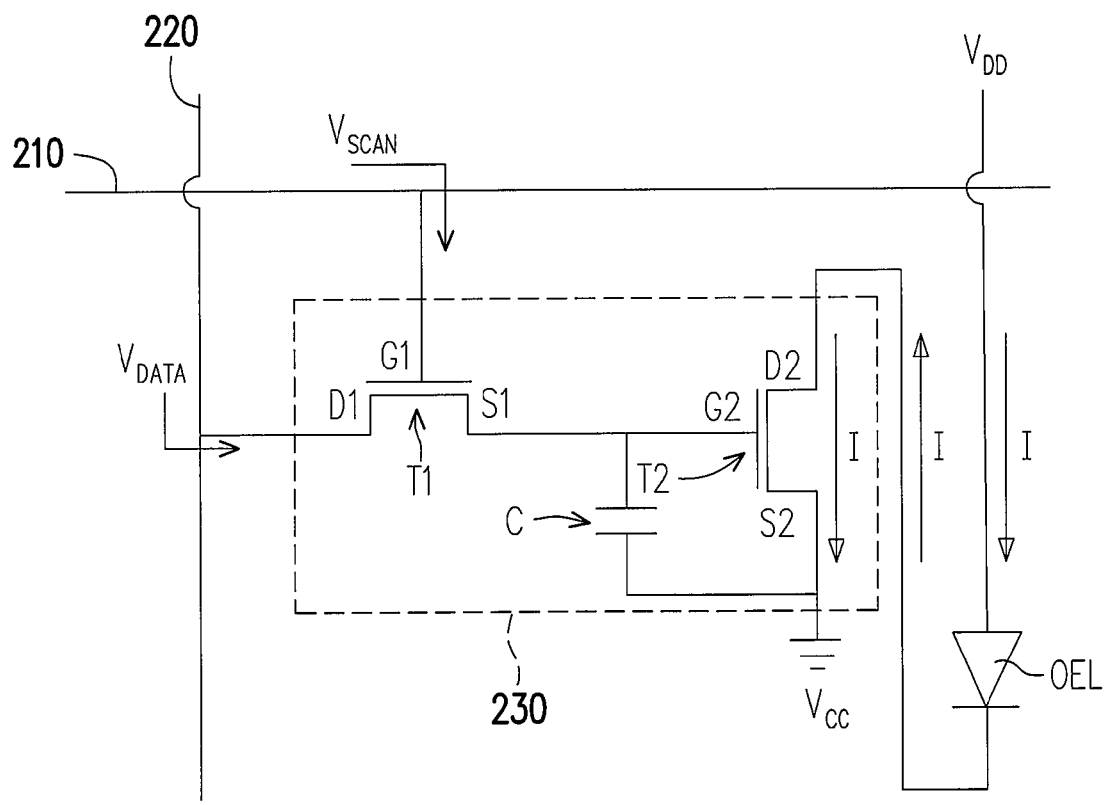
FIG. 2 is the schematic drawing of a driving circuit according to the present invention.

FIG. 2 is the schematic drawing of a driving circuit according to the present invention. Referring to FIG. 2, a driving circuit 200 is coupled with a higher voltage source $V_{DD}$ and a lower voltage source $V_{CC}$ to drive an organic electro-luminescence device OEL. It can be seen from FIG. 2, the driving circuit 200 includes a scan line 210, a data line 220 and a control unit 230. The control unit 230 is electrically coupled to the scan line 210, the data line 220 and the lower voltage source $V_{CC}$, while the organic electro-luminescence device OEL is electrically coupled between the control unit 230 and the higher voltage source $V_{DD}$. In the preferred embodiment of the present invention, the voltage provided by the higher voltage source $V_{DD}$ is a positive voltage (V1 volt), the voltage provided by the lower voltage source $V_{CC}$ (V2 volt) is a positive voltage or a negative voltage, wherein V1>V2 and the lower voltage source $V_{CC}$ can be grounded with V2=0.

In the driving circuit 200 of the present invention, the control unit 230 can have a plurality of circuit layouts, for example, a 2T1C architecture, an 4T1C architecture, and the like. In the following, only the 2T1C architecture is explained exemplarily, but the present invention does not limit the circuit layout to the 2T1C architecture only. Anyone skilled in the art should be able to derive a circuit of the control unit adopting the 4T1C architecture or other architectures referring to the given disclosure of the present invention without any difficulty.

It can be seen from FIG. 2, in the preferred embodiment of the present invention, the control unit 230 includes a first TFT T1, a second TFT T2 and a capacitor C. The first TFT T1 has a first gate G1, a first source S1 and a first drain D1, wherein the first gate G1 is electrically coupled to the scan line 210 and the first drain D1 is electrically coupled to the data line D1. The second TFT T2 has a second gate G2, a second source S2 and a second drain D2, wherein the second gate G2 is electrically coupled to the first source S1, the second source S2 is electrically coupled to the lower voltage source $V_{CC}$ and the second drain D2 is electrically coupled to the organic electro-luminescence device OEL. In addition, the organic electro-luminescence device OEL has an anode (+) electrically coupled to the higher voltage source $V_{DD}$ and a cathode (−) electrically coupled to the second drain D2.

Note that in the driving circuit 200 of the present invention, the capacitor C is electrically coupled between the second gate G2 and the second source S2, so as to effectively keep the voltage difference between the second gate G2 and the second source S2 and further to avoid a luminance decay problem caused by the long term operation current flowing though the organic electro-luminescence device OEL.

In the preferred embodiment of the present invention, the first TFT T1 and the second TFT T2 can be an amorphous silicon TFT (a-Si TFT), a low temperature poly silicon TFT (LTPS TFT) or an organic silicon TFT. Besides, the first TFT T1 and the second TFT T2 can be a top gate TFT or a bottom gate TFT as well.

When a scan signal $V_{SCAN}$ arrives at the scan line 210, the first TFT T1 would be on and the data signal $V_{DATA}$ delivered by the data line 220 is applied to the gate G2 of the second TFT T2 via the first TFT T1. The voltage signal $V_{DATA}$ applied to the second gate G2 controls a current I flowing through the second TFT T2 and the organic electro-luminescence device OEL, so as to control the luminance thereof. While the voltage signal $V_{DATA}$ delivered by the data line 220 is applied to the second gate G2, the voltage signal $V_{DATA}$ also charges the capacitor C with a reference voltage of the lower voltage source $V_{CC}$. In other words, as the voltage signal $V_{DATA}$ is applied to the second gate G2, the capacitor C records down the voltage between the G2 and D2 terminals of $|V_{DATA} - V_{DD}|$. In the driving circuit of the present invention, as the first TFT T1 is off, the capacitor C is able to effectively keep the voltage $V_{DATA}$ applied to the second gate G2 of the second TFT T2. In addition, after a long term operation, since the capacitor C is electrically coupled between the second gate G2 and the second source S2, the voltage $V_s$ at the second source S2 would not drift seriously, which makes the voltage difference $V_{gs}$ between the second gate G2 and the second source S2 lightly varied, the current I flowing through the organic electro-luminescence device OEL effectively controlled by using the design and the display quality of the organic electro-luminescence device OEL more stable.

According to the embodiment of the present invention, the method of fabricating the driving circuit 200 of FIG. 2 on an active matrix OELD panel is explained in detail as follows.

FIGS. 3A-3G are cross-sectional views in a flowchart for fabricating an active matrix OELD panel according to an embodiment of the present invention. First referring to FIG. 3A, a substrate 300 is provided, followed by forming a conductive layer 302 on the substrate 300, wherein the conductive layer 302 is served as the anode of the organic electro-luminescence device in the active matrix OELD panel provided by the present invention. The material of the conductive layer 302 is, for example, indium tin oxide (ITO), indium zinc oxide (IZO) or other transparent/opaque conductive materials. In the embodiment, the conductive layer 302 is, for example, a plurality of stripe conductive material layers. Then, a bus line 304 is formed on the substrate 300 and a part of the conductive layer 302, wherein the bus line 304 is electrically coupled to the conductive layer 302 and makes the plurality of conductive layers 302 simultaneously electrically coupled to the higher voltage source $V_{DD}$. The material of the bus line 304 is, for example, metal, alloy or other transparent/opaque conductive materials.

Figure 3A:
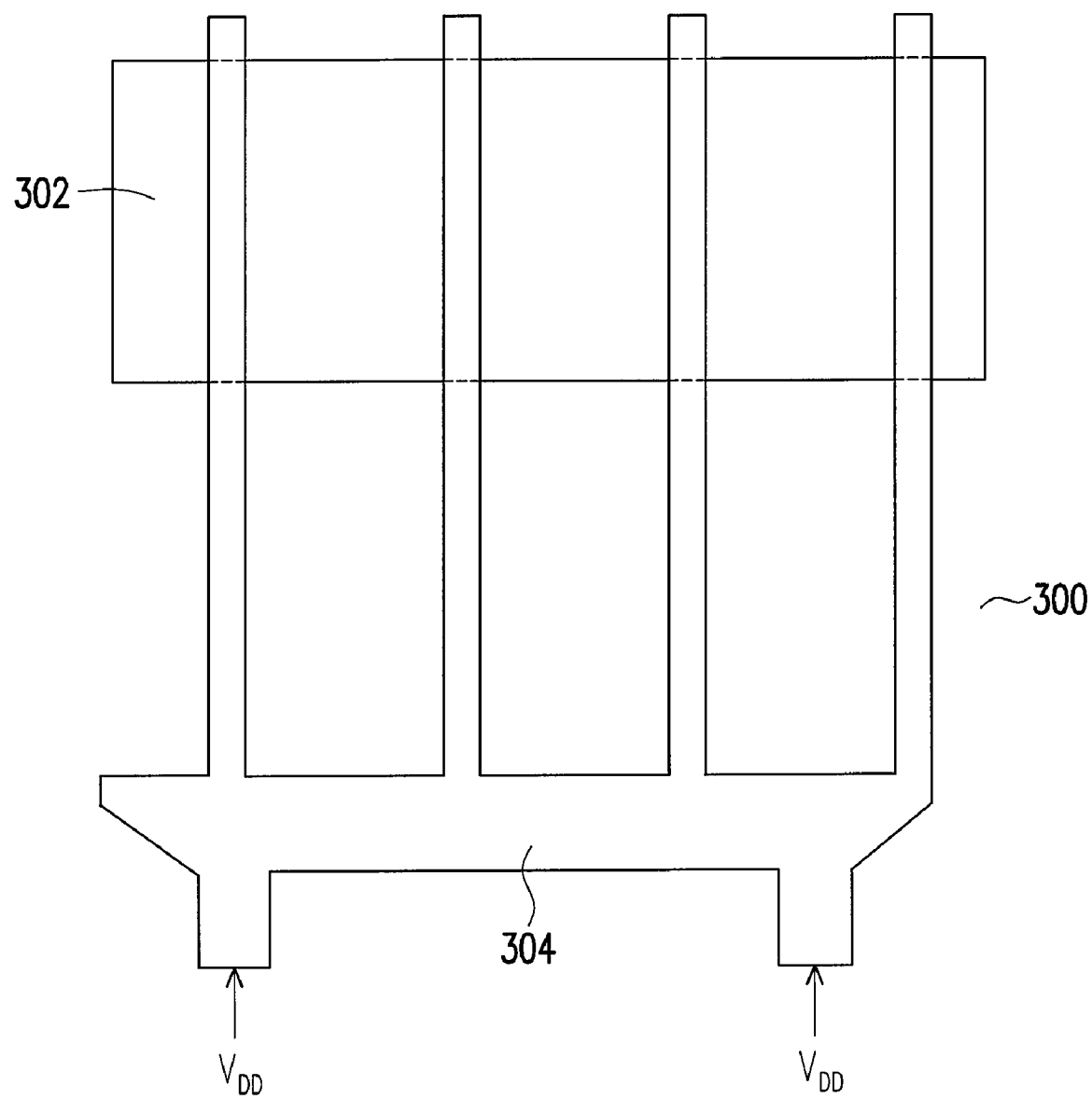
FIGS. 3A-3G are various cross-sectional views in a flowchart for fabricating an active matrix OELD panel according to an embodiment of the present invention.
Figure 3B:
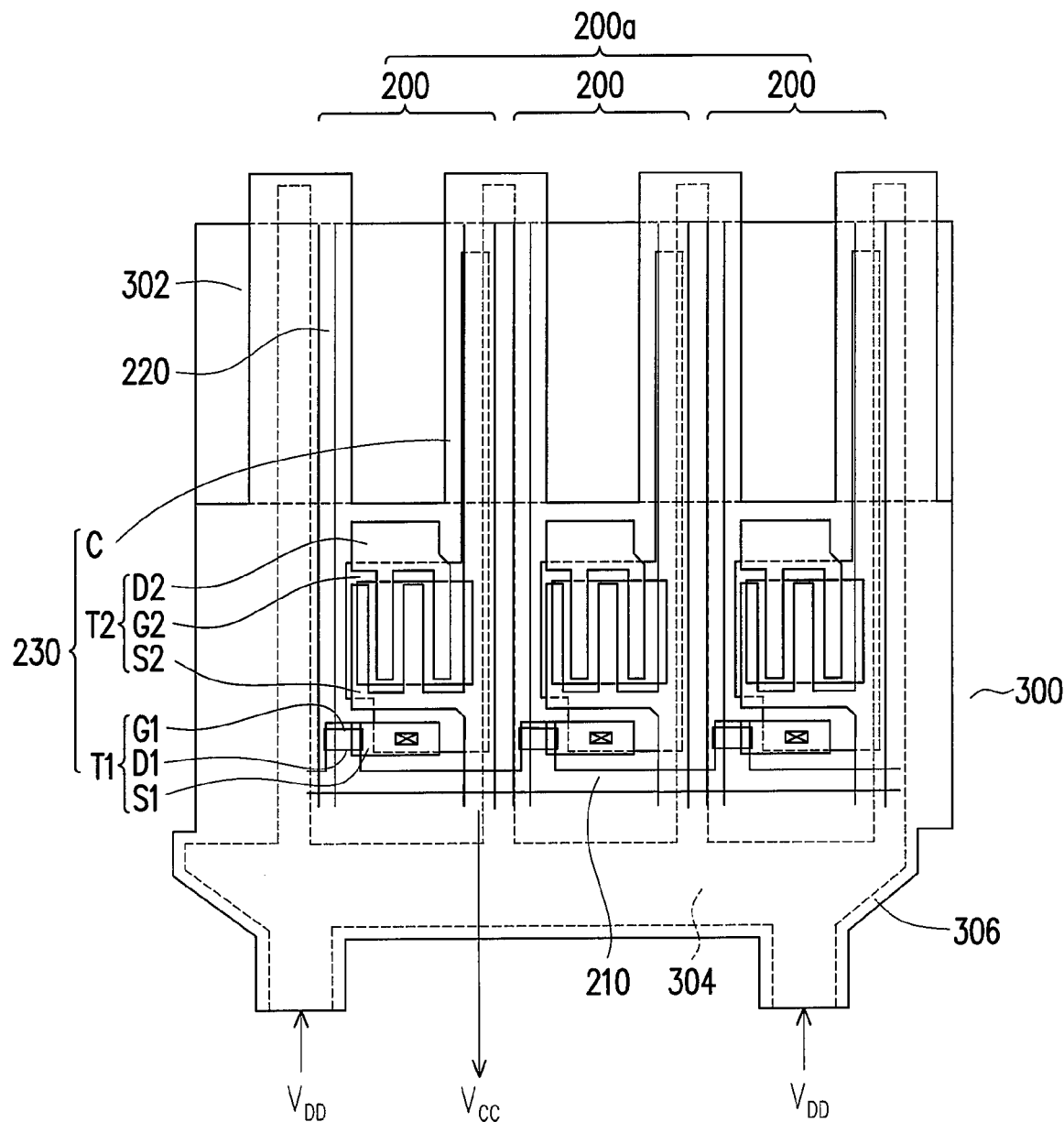

Next referring to FIG. 3B, an insulating layer 306 is formed on the substrate 300 for electrically insulating the conductive layer 302 and the bus line 304 from the successively formed driving circuit array. In addition, the insulating layer 306 exposes a part of the conductive layer 302, i.e. the area served for the organic electro-luminescence device to display. Then, a driving circuit array 200a is formed on the insulating layer 306. The driving circuit array 200a includes a plurality of driving circuits 200 arranged in an array. All the components of each the driving circuit 200 (for example, the scan line 210, data line 220, control unit 230, first TFT T1 and second TFT T2, capacitor C and the lower voltage source $V_{CC}$) and the electrical coupling relationships between all the components are the same as described in FIG. 2, and herein they are omitted for simplicity.

The above-mentioned scan line 210 and data line 220, the first TFT T1, the second TFT T2 and the capacitor C in the control unit 230 can be fabricated by using the currently adopted TFT array processes, for example, the amorphous silicon TFT array (a-Si TFT array) process, the low temperature poly silicon TFT array (LTPS TFT array) process or the organic silicon TFT array process.

In the embodiment, the extension direction of the conductive layer 302 is parallel to the extension direction of the scan line 210 and the extension direction of the bus line 304 is perpendicular to the scan line 210. However, the extension direction can be parallel to the extension direction of the data line 220 or can be in other extension directions by design, while the extension direction of the bus line 304 is varied with the extension direction of the conductive layer 302.

Figure 4A:
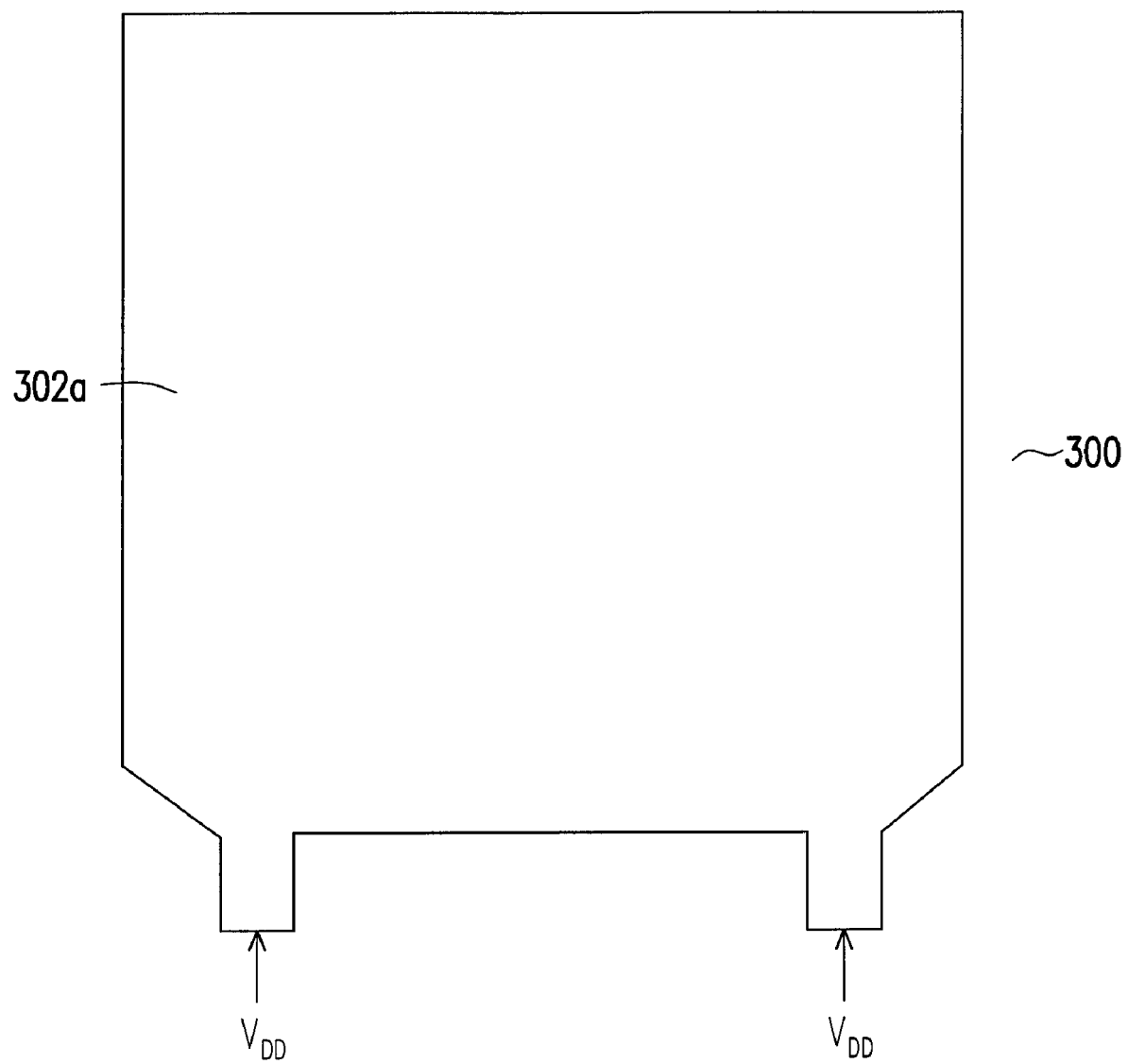
FIG. 4A is a diagram of an anode in an OEL device according to another embodiment of the present invention.
Figure 4B:
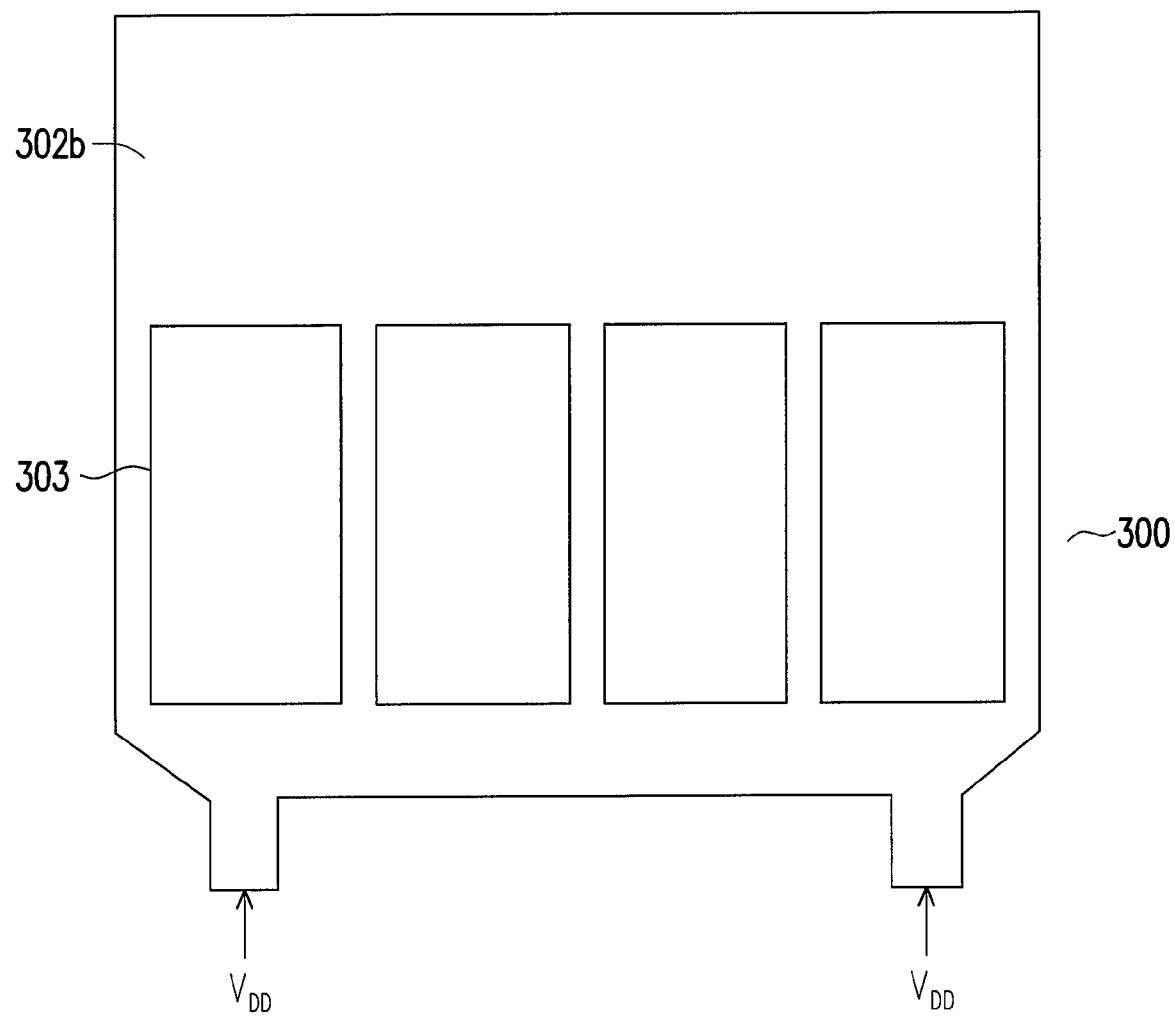
FIG. 4B is a diagram of an anode in an OEL device according to another yet embodiment of the present invention.

Note that the anode of the above-mentioned organic electro-luminescence device can be composed of a plurality of stripe conductive layers, or be a common anode formed by a lump of conductive material layer 302a (referring to FIG. 4A), or be a common anode formed by a patterned conductive material layer 302b (referring to FIG. 4B), wherein in the patterned conductive material layer 302b a plurality of openings 303 is disposed and the openings 303 expose a part of the substrate 300. In other words, the conductive material layer 302b has a plurality of openings 303 therein, while the first TFT T1 and the second TFT T2 in the successively formed driving circuit 200 are located on the insulating layer 306 over the opening 303. In this way, when the anode of the organic electro-luminescence device is a common anode, the step of fabricating the bus line 304 can be saved.

Figure 3C:
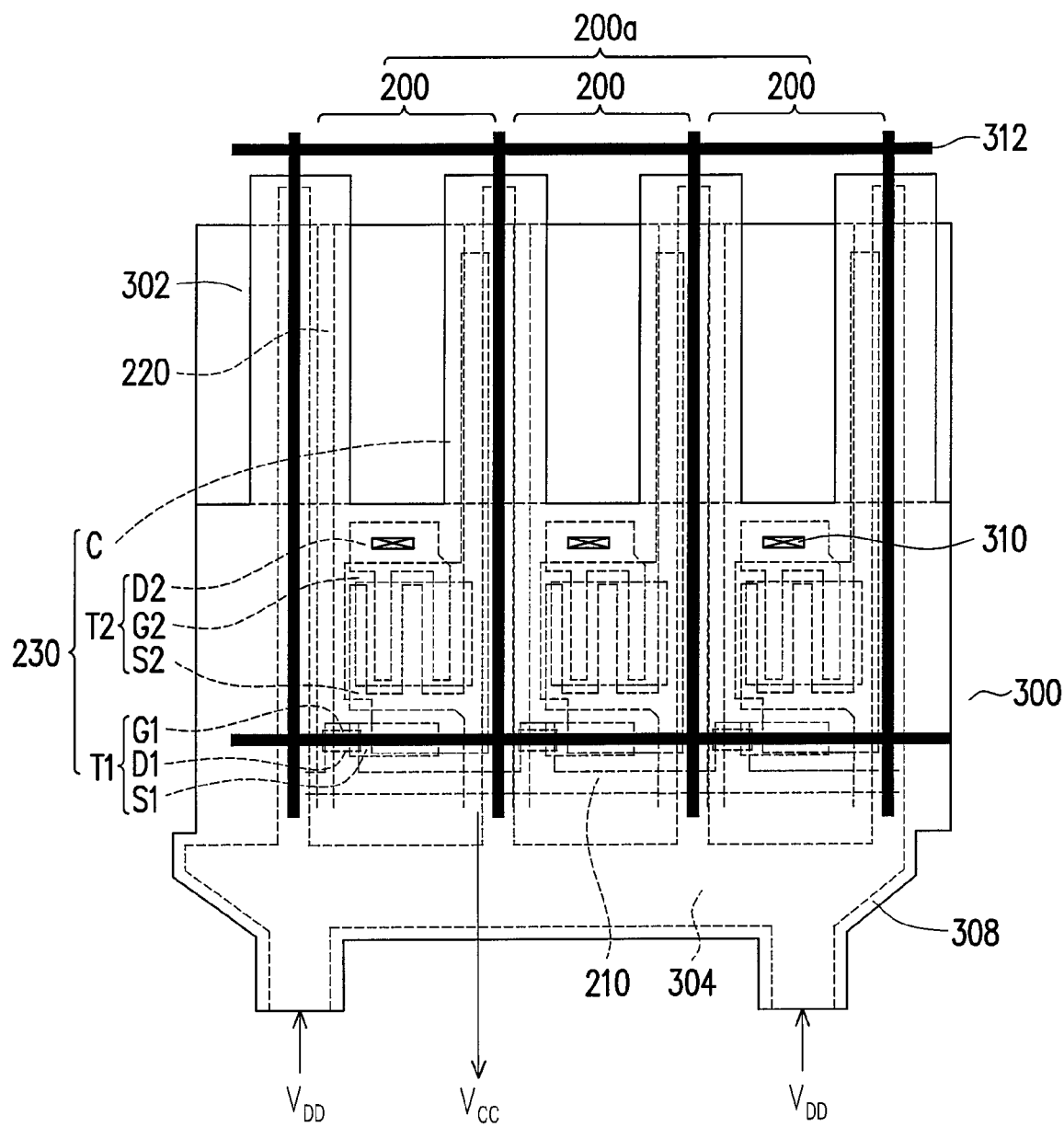

Further referring to FIG. 3C, a protection layer 308 is formed on the insulating layer 306. The protection layer 308 covers the driving circuit array 200a and has a plurality of via holes 310 to expose a part of the second drain D2. The material of the protection layer 308 is, for example, polyimide (PI), epoxy or other materials. Then, a barrier pattern 312 is formed on the protection layer 308 for defining the position of the successively formed cathode. The material of the barrier pattern 312 is, for example, dielectric material, and the sidewall of the barrier pattern 312 has an undercut profile, so that the successively formed film layers can be automatically separated into individual film patterns by the barrier pattern 312.

Figure 3D:
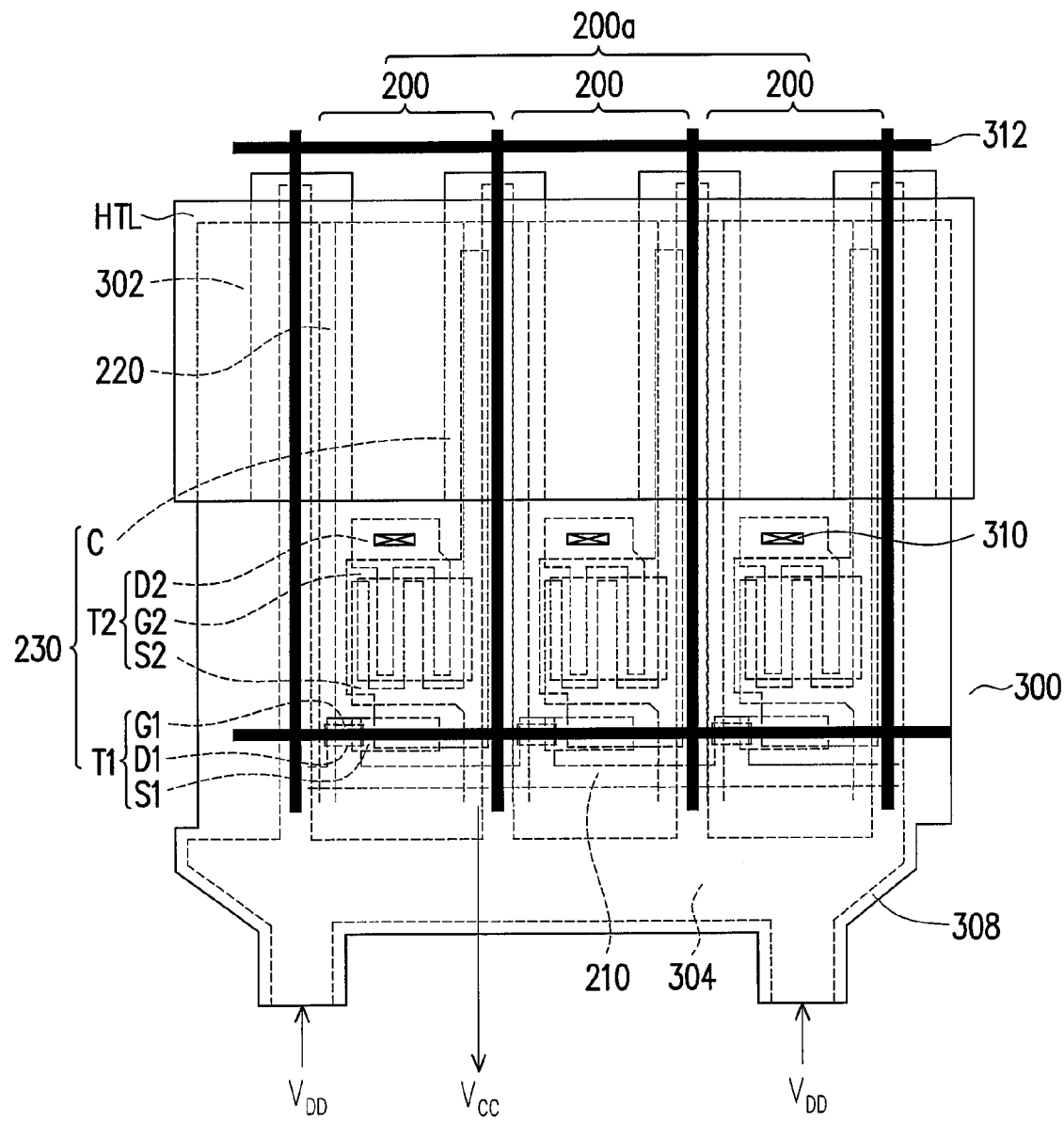
Figure 3E:
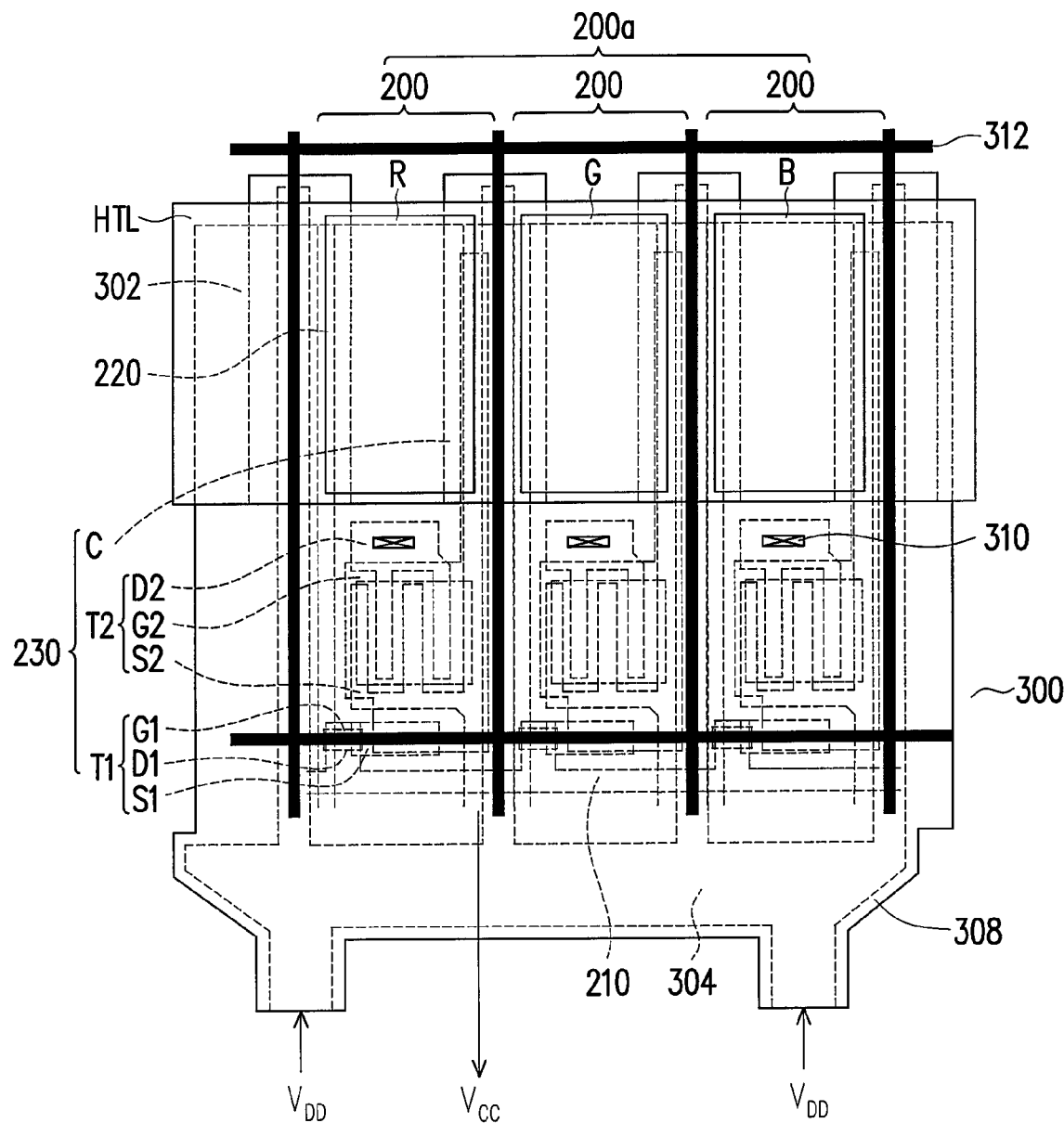
Figure 3F:
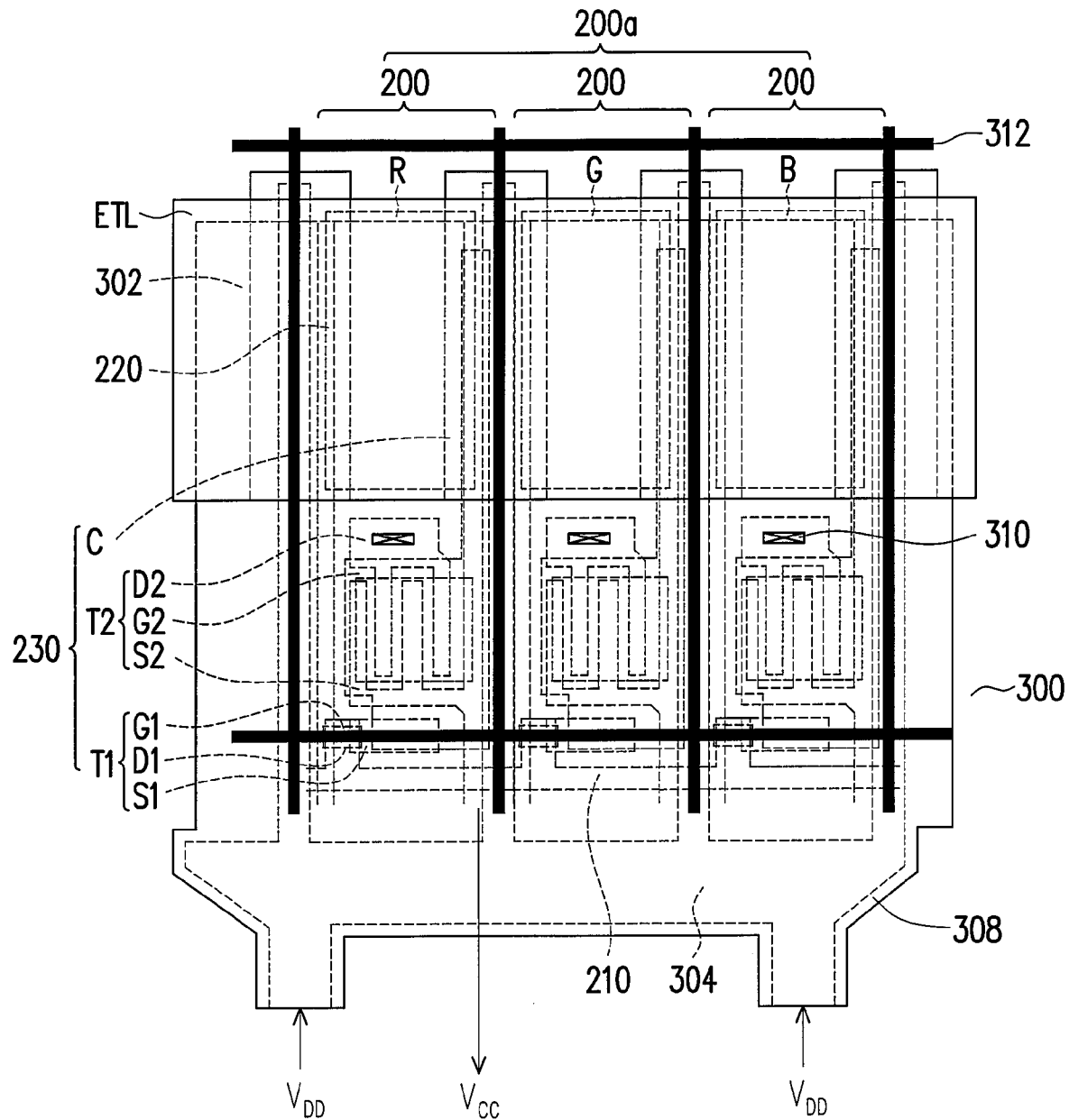

Furthermore referring to FIGS. 3D-3F, after forming the barrier pattern 312, an organic functional layer is formed on the conductive layer 302. Since the barrier pattern 312 is capable of automatically separating the film layers, hence, while forming the organic functional layer, an organic material layer is formed on the barrier pattern 312 as well, wherein the material of the organic material layer and the material of the organic functional layer are the same. In the embodiment, the organic functional layer is, for example, a hole transporting layer HTL, organic electro-luminescence layers R, G and B and an electron transporting layer ETL, wherein HTL, R, G and B and ETL are sequentially formed on the conductive layer 302 and all the organic film layers can be fabricated by using vapor deposition process or ink-jet printing process.

Figure 3G:
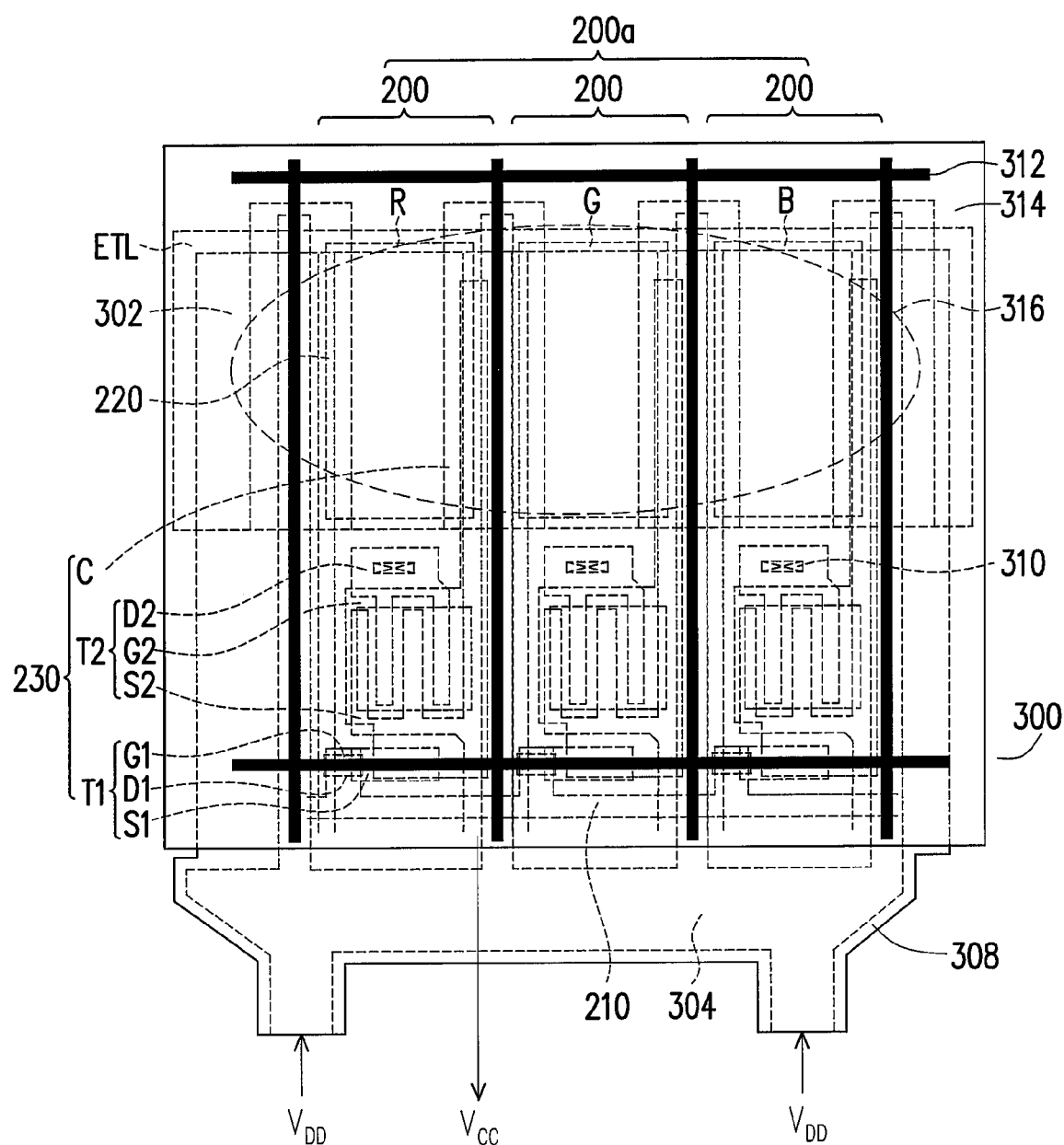

Moreover referring to FIG. 3G, a plurality of conductive layers 314 is formed on each organic functional layer, wherein the conductive layers 314 are electrically insulated from each other and served as the cathodes of the organic electro-luminescence devices in the active matrix OELD panel of the present invention. In addition, the conductive layers 314 are electrically coupled to each second drain D2 of the driving circuit array 200a through the via holes 310, respectively. Since the barrier pattern 312 is capable of automatically separating the film layers, hence, while forming the conductive layer 314, a conductive material layer is formed on the organic material layer as well, wherein the material of the conductive material layer and the material of the conductive layer 314 are the same, for example, aluminium metal.

Note that the above-mentioned hole transporting layer HTL, organic electro-luminescence layers R, G and B and electron transporting layer ETL are not necessarily patterned with the barrier pattern 312; they can be patterned in other ways in other embodiments, for example, by using deposition process incorporated with a shadow mask or using ink-jet printing process, wherein for the two processes, the step of fabricating the barrier pattern 312 is saved. When the step of fabricating the barrier pattern 312 is saved, another barrier pattern can be formed after forming the hole transporting layer HTL, organic electro-luminescence layers R, G and B and electron transporting layer ETL, so as to form conductive layers 314 electrically insulated from each other. The conductive layer 314 can be formed also by using deposition process incorporated with a shadow mask.

Once the conductive layers 314 electrically insulated from each other are finished, all the organic electro-luminescence devices OEL and the organic electro-luminescence device array 316 composed of a plurality of organic electro-luminescence devices OEL arranged in an array are regarded as being finished as well.

In the following, FIG. 3G is explained to describe the active matrix OELD panel of the present invention.

Referring to FIG. 3G, the active matrix OELD panel of the present invention includes a substrate 300, an organic electro-luminescence device array 316, a driving circuit array 200a and an insulating layer (not shown). The organic electro-luminescence device array 316 includes a plurality of organic electro-luminescence devices arranged in an array, wherein the anodes of the organic electro-luminescence device array 316 (conductive layers 302) are disposed on the substrate 300. The driving circuit array 200a is disposed on the organic electro-luminescence device array 316. The insulating layer is disposed on the substrate 300 and located between the organic electro-luminescence device array 316 and the driving circuit array 200a to electrically insulate the organic electro-luminescence device array 316 from the driving circuit array 200a. In addition, the insulating layer exposes a part of each organic electro-luminescence device.

The driving circuit array 200a includes a plurality of driving circuits 200 arranged in an array, wherein the driving circuit 200 is coupled with a higher voltage source $V_{DD}$ and a lower voltage source $V_{CC}$ to drive the corresponding organic electro-luminescence device. All the components of each the driving circuit 200 and the electrical coupling relationships between all the components are the same as described in FIG. 2, and herein they are omitted for simplicity.

In the embodiment, the organic electro-luminescence device array 316 further includes a bus line 304, an organic functional layer and a plurality of cathodes electrically insulated from each other (conductive layers 314). The above-mentioned anodes (the conductive layers 302) are, for example, a plurality of stripe electrodes, wherein the extension direction of the stripe electrodes is, for example, parallel to the extension direction of the scan line 210. The bus line 304 is electrically coupled to the anodes (the conductive layers 302), so as to electrically couple all the anodes (the conductive layers 302) simultaneously to the higher voltage source $V_{DD}$. The extension direction of the bus line 304 is, for example, perpendicular to the extension direction of the scan lines 210. However, the extension direction of the stripe anodes (the conductive layer 302) can be parallel to the extension direction of the data line 220 or can be in other extension directions by design, while the extension direction of the bus line 304 is varied with the extension direction of the striped anodes (the conductive layers 302).

The organic functional layers are disposed on the anodes (the conductive layers 302) and include, for example, a hole transporting layer HTL, organic electro-luminescence layers R, G and B and an electron transporting layer ETL, which are sequentially disposed on the anodes (the conductive layers 302). The cathodes (the conductive layers 314) are disposed on the corresponding organic functional layers and electrically coupled to the corresponding second drains D2, respectively.

In addition, a protection layer 308 is optionally disposed on the insulating layer, while a barrier pattern 312 is optionally disposed on the protection layer 308 to electrically insulate the cathodes (the conductive layers 314) from each other. The protection layer 308 has a plurality of via holes 310, while the cathodes (the conductive layers 314) are electrically coupled to the second drains D2 through the via holes 310. The organic material layer (not shown) is disposed on the barrier pattern 312, while the conductive material layer (not shown) is disposed on the organic material layer. The material of the organic material layer and the material of the organic functional layer are the same, while the material of the conductive material layer and the material of the cathode (the conductive layer 314) are the same.

Note that the anode (the conductive layers 302) can be a plurality of stripe electrodes or a lump-shape common electrode. In another embodiment, where the anode is a common electrode (i.e. the conductive material layer 302a in FIG. 4A), the bus line 304 can be saved; in another yet embodiment, where the common electrode (i.e. the conductive material layer 302b in FIG. 4B) has a plurality of openings 303 therein, the first TFT T1 and the second TFT T2 are located on the insulating layer over the openings 303.

In summary, since the present invention makes the organic electro-luminescence device (OEL device) electrically coupled between the control unit and the higher voltage source $V_{DD}$, so that the driving current sequentially flows through the OEL device and the control unit under the control of the control unit. Therefore, the driving circuit of the present invention enables the active matrix OELD panel to have better display quality. In addition, the method of fabricating the active matrix OELD panel of the present invention is compatible with the currently adopted process without too heavy cost burden.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An active matrix organic electro-luminescence display panel, comprising:
    a substrate;
    an organic electro-luminescence device array, comprising a plurality of organic electro-luminescence devices, wherein a common anode of the organic electro-luminescence device array is disposed on the substrate and coupled to the higher voltage source;
    a driving circuit array, disposed on the organic electro-luminescence device array and comprising a plurality of driving circuits, wherein the driving circuits are coupled with the higher voltage source and a lower voltage source to drive the corresponding organic electro-luminescence devices and each driving circuit comprises:
        a scan line;
        a data line; and
        a control unit, electrically coupled to the scan line, the data line and the lower voltage source, wherein the corresponding organic electro-luminescence device is electrically coupled between the control unit and the higher voltage source; and
    an insulating layer, disposed on the substrate and located between the organic electro-luminescence device array and the driving circuit array, wherein the insulating layer exposes a part of each organic electro-luminescence device.

2. The active matrix organic electro-luminescence display panel according to claim 1, wherein the voltage of the higher voltage source is V1 volt, the voltage of the lower voltage source is V2 volt and V1>V2=0.

3. The active matrix organic electro-luminescence display panel according to claim 1, wherein each control unit comprises:
    a first thin film transistor, having a first gate, a first source and a first drain, wherein the first gate is electrically coupled to the scan line, while the first drain is electrically coupled to the data line;
    a second thin film transistor, having a second gate, a second source and a second drain, wherein the second gate is electrically coupled to the first source, the second source is electrically coupled to the lower voltage source and the second drain is electrically coupled to the corresponding organic electro-luminescence device; and
    a capacitor, electrically coupled between the second gate and the second source.

4. The active matrix organic electro-luminescence display panel according to claim 3, wherein the first thin film transistor and the second thin film transistor are amorphous silicon thin film transistors.

5. The active matrix organic electro-luminescence display panel according to claim 3, wherein the first thin film transistor and the second thin film transistor are low temperature poly silicon thin film transistor.

6. The active matrix organic electro-luminescence display panel according to claim 3, wherein the first thin film transistor and the second thin film transistor are organic silicon thin film transistors.

7. The active matrix organic electro-luminescence display panel according to claim 3, wherein the organic electro-luminescence device array further comprises:
    a plurality of organic functional layers, disposed on the common anode; and
    a plurality of cathodes electrically insulated from each other and disposed on the corresponding organic functional layers respectively, wherein each cathode is electrically coupled to the corresponding second drain.

8. The active matrix organic electro-luminescence display panel according to claim 7, further comprising a protection layer disposed on the insulating layer.

9. The active matrix organic electro-luminescence display panel according to claim 8, further comprising a barrier pattern disposed on the protection layer to electrically insulate the cathodes from each other.

10. The active matrix organic electro-luminescence display panel according to claim 9, further comprising:
- an organic material layer, disposed on the barrier pattern; and
- a conductive material layer, disposed on the organic material layer,
- wherein a material of the organic material layer and a material of the organic functional layer are the same and a material of the conductive material layer and a material of the cathodes are the same.

11. The active matrix organic electro-luminescence display panel according to claim 7, wherein each organic functional layer comprises:
- a hole transporting layer, disposed on the common anode;
- an organic electro-luminescence layer, disposed on the hole transporting layer; and
- an electron transporting layer, disposed on the organic electro-luminescence layer.

12. The active matrix organic electro-luminescence display panel according to claim 7, wherein the common anode has a plurality of openings therein and the control units are located over the openings.

* * * * *